United States Patent
Nakanishi et al.

(10) Patent No.: US 10,418,784 B2
(45) Date of Patent: Sep. 17, 2019

(54) SURFACE EMITTING LASER, INFORMATION ACQUIRING APPARATUS, IMAGING APPARATUS, LASER ARRAY, AND METHOD OF MANUFACTURING SURFACE EMITTING LASER

(71) Applicant: CANON KABUSHIKI KAISHA, Tokyo (JP)

(72) Inventors: Koichiro Nakanishi, Tokyo (JP); Yasuhiro Nagatomo, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/538,362

(22) PCT Filed: Dec. 8, 2015

(86) PCT No.: PCT/JP2015/006108
§ 371 (c)(1),
(2) Date: Jun. 21, 2017

(87) PCT Pub. No.: WO2016/103604
PCT Pub. Date: Jun. 30, 2016

(65) Prior Publication Data
US 2017/0353010 A1    Dec. 7, 2017

(30) Foreign Application Priority Data

Dec. 26, 2014  (JP) ................... 2014-265572
Nov. 12, 2015  (JP) ................... 2015-222514

(51) Int. Cl.
*H01S 5/183* (2006.01)
*G02F 1/1335* (2006.01)
(Continued)

(52) U.S. Cl.
CPC .... *H01S 5/18366* (2013.01); *G02F 1/133528* (2013.01); *H01S 5/041* (2013.01);
(Continued)

(58) Field of Classification Search
CPC . H01S 5/1866; H01S 5/18369; H01S 5/18366
See application file for complete search history.

(56) References Cited

U.S. PATENT DOCUMENTS 4,825,262 A * 4/1989 Mallinson .............. G01D 5/266
                                                          356/454
5,771,253 A    6/1998 Chang-Hasnain et al.
(Continued)

FOREIGN PATENT DOCUMENTS

JP    2002-500446 A    1/2002
JP    2002-319740 A    10/2002
(Continued)

OTHER PUBLICATIONS

International Search Report and Written Opinion for PCT/JP2016/002148 and notification of transmittal of the ISR/WO, dated Jul. 28, 2016.
(Continued)

*Primary Examiner* — Tod T Van Roy
(74) *Attorney, Agent, or Firm* — Canon U.S.A., Inc. I.P. Division

(57) ABSTRACT

A surface emitting laser having a wide wavelength tunable band is provided.
A surface emitting laser includes a first reflecting mirror (102); a second reflecting mirror (116); and an active layer (104) arranged between the first reflecting mirror (102) and the second reflecting mirror (116), a gap being formed between the second reflecting mirror (116) and the active layer (104), an oscillation wavelength being tunable. The second reflecting mirror (116) includes a beam (108) comprising a single-crystal semiconductor, and a dielectric multilayer film (110) supported by the beam (108), and the dielectric multilayer film (110) is arranged in an opening (118) formed in the beam (108).

11 Claims, 8 Drawing Sheets

(51) Int. Cl.
*H01S 5/04* (2006.01)
*H01S 5/42* (2006.01)
*G01B 9/02* (2006.01)

(52) U.S. Cl.
CPC ...... *H01S 5/18311* (2013.01); *H01S 5/18369* (2013.01); *H01S 5/423* (2013.01); *G01B 9/02091* (2013.01)

(56) References Cited

U.S. PATENT DOCUMENTS

| | | | |
|---|---|---|---|
| 6,538,748 B1* | 3/2003 | Tucker | G01J 3/26 356/519 |
| 8,059,690 B2 | 11/2011 | Chang-Hasnain et al. | |
| 8,189,643 B2 | 5/2012 | Chang-Hasnain et al. | |
| 8,989,230 B2* | 3/2015 | Dummer | H01S 5/0261 372/20 |
| 2002/0061042 A1 | 5/2002 | Wang et al. | |
| 2002/0131458 A1 | 9/2002 | Sirbu et al. | |
| 2002/0135909 A1* | 9/2002 | Rankin | H01S 5/18366 359/856 |
| 2002/0155909 A1* | 10/2002 | Roby | F16H 55/56 474/14 |
| 2003/0012231 A1* | 1/2003 | Tayebati | G01J 3/26 372/20 |
| 2004/0076198 A1* | 4/2004 | Spoonhower | H01S 5/18366 372/20 |
| 2005/0074197 A1* | 4/2005 | Tada | B82Y 20/00 385/14 |
| 2008/0159468 A1 | 7/2008 | Chong | |
| 2009/0303487 A1* | 12/2009 | Bond | G01N 21/39 356/437 |
| 2012/0189184 A1 | 7/2012 | Matsumoto et al. | |
| 2014/0268169 A1 | 9/2014 | Jayaraman et al. | |
| 2015/0010031 A1 | 1/2015 | Makino et al. | |
| 2016/0164254 A1* | 6/2016 | Inao | H01S 5/0264 356/479 |
| 2016/0301189 A1* | 10/2016 | Cable | G01B 9/02091 |

FOREIGN PATENT DOCUMENTS

| | | |
|---|---|---|
| JP | 2004-140371 A | 5/2004 |
| JP | 2004-281733 A | 10/2004 |
| JP | 2010-62426 A | 3/2010 |
| WO | 2016/174857 A1 | 11/2016 |

OTHER PUBLICATIONS

International Search Report and Written Opinion for PCT/JP2015/006108 and notification of transmittal of the ISR/WO, dated Apr. 4, 2016.
Yano, et al., "Wavelength Modulation Over 500 kHz of Micromechanically Tunable InP-Based VCSELs With Si-MEMS Technology", IEEE Journal of Selected Topics in Quantum Electronics, May/Jun. 2009, vol. 15, No. 3, pp. 528-534.
Wang, et al., "Half-symmetric cavity microelectromechanically tunable vertical cavity surface emitting lasers with single spatial mode operating near 950 nm", Applied Physics Letters, American Institute of Physics, Aug. 16, 1999, vol. 75, No. 7, pp. 897-898.
Huber, et al., "Reducing Brownian Motion in an Electrostatically Tunable MEMS Laser", Journal of Microelectromechanical Systems, Oct. 2004, vol. 13, No. 5, pp. 732-736.
Cole, et al., "Short-Wavelength MEMS-tunable VCSELs", Optics Express, Sep. 29, 2008, vol. 16, No. 20, p. 16093-16103.

* cited by examiner

SURFACE EMITTING LASER, INFORMATION ACQUIRING APPARATUS, IMAGING APPARATUS, LASER ARRAY, AND METHOD OF MANUFACTURING SURFACE EMITTING LASER

TECHNICAL FIELD

The present invention relates to a surface emitting laser, an information acquiring apparatus, an imaging apparatus, a laser array, and a method of manufacturing the surface emitting laser.

BACKGROUND ART

Since a wavelength tunable laser that can change its oscillation wavelength is expected to be applied to various fields, such as communication, sensing, and imaging, the wavelength tunable laser is being actively studied and developed in recent years. As such a wavelength tunable laser, a configuration that moves one of a pair of reflecting mirrors of a vertical cavity surface emitting laser (hereinafter, referred to as VCSEL) is developed. To be specific, the cavity length is varied by mechanically moving one (a movable mirror) of the pair of reflecting mirrors by micro electro mechanical systems (hereinafter, referred to as MEMS) technology and hence the oscillation wavelength of VCSEL is changed.

Also, for the movable mirror, a distributed Bragg reflector (hereinafter, referred to as DBR) may be used. NPL 1 discloses wavelength tunable VCSEL including dielectric DBR as a movable mirror.

CITATION LIST

Patent Literature

PTL 1: U.S. Pat. No. 8,059,690
PTL 2: U.S. Pat. No. 8,189,643

Non Patent Literature

NPL 1: Garrett D. Cole and three others, "Short-Wavelength MEMS-tunable VCSELs," OPTICS EXPRESS, Sep. 29, 2008, Vol. 16, No. 20, p. 16093-16103

SUMMARY OF INVENTION

Technical Problem

As shown in FIG. 4 of NPL 1, the dielectric DBR has a high reflectivity in a wide wavelength band. However, the reflectivity spectrum of the dielectric DBR has a region called dip in which the reflectivity is largely decreased as compared with other regions. In the wavelength tunable VCSEL, the oscillation threshold increases with the wavelength corresponding to the dip. Hence, oscillation hardly occurs, and the wavelength tunable band cannot be widened.

The present invention provides a surface emitting laser with a wide wavelength tunable band.

Solution to Problem

According to an aspect of the present invention, there is provided a surface emitting laser comprising a first reflecting mirror, a second reflecting mirror, and an active layer arranged between the first reflecting mirror and the second reflecting mirror, a gap being formed between the second reflecting mirror and the active layer, an oscillation wavelength being tunable. The second reflecting mirror includes a beam comprising a single-crystal semiconductor and a dielectric multilayer film supported by the beam, and the dielectric multilayer film is arranged in an opening formed in the beam.

According to another aspect of the present invention, there is provided a surface emitting laser comprising a first reflecting mirror, a second reflecting mirror, an active layer arranged between the first reflecting mirror and the second reflecting mirror, a gap being formed between the second reflecting mirror and the active layer. The second reflecting mirror includes a beam and a multilayer film supported by the beam, the multilayer film is arranged in an opening formed in the beam, and the multilayer film is arranged continuously from the opening to a portion around the opening of the surface of the beam opposite to the surface facing the active layer.

Also, according to another aspect of the present invention, there is provided a method of manufacturing a surface emitting laser, the surface emitting laser including a first reflecting mirror, a second reflecting mirror, and an active layer arranged between the first reflecting mirror and the second reflecting mirror, a gap being formed between the second reflecting mirror and the active layer, an oscillation wavelength being tunable. The method includes forming a first reflecting mirror, an active layer, and a sacrificial layer in that order; forming a beam precursor layer on the sacrificial layer, the beam precursor layer being made of a single-crystal semiconductor; forming an opening in the beam precursor layer, the opening penetrating through the beam precursor layer; forming a dielectric multilayer film in the opening; and removing the sacrificial layer, forming a gap between the second reflecting mirror and the active layer, and forming a beam.

Advantageous Effects of Invention

With the aspects of the present invention, the surface emitting laser with the wide wavelength tunable band can be obtained.

Further features of the present invention will become apparent from the following description of exemplary embodiments with reference to the attached drawings.

DESCRIPTION OF EMBODIMENTS

Figure 8:
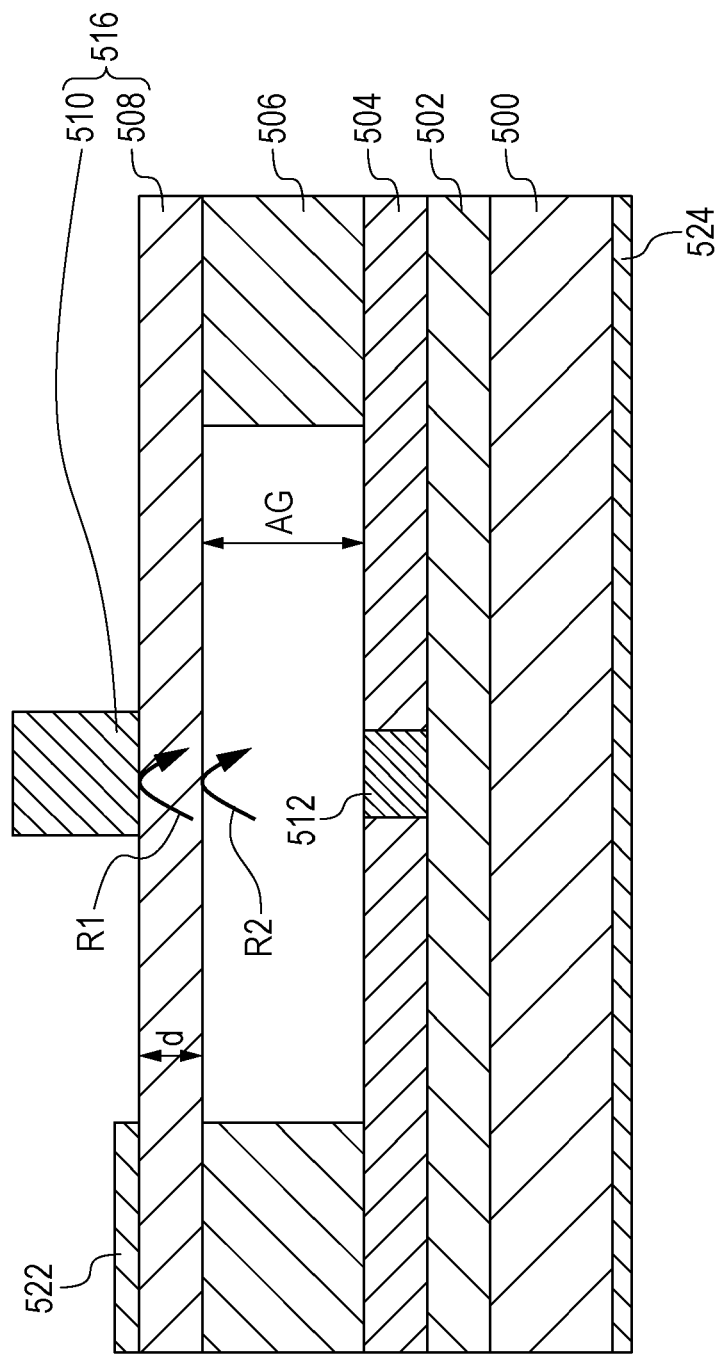
FIG. 8 is a schematic cross-sectional view showing a surface emitting laser according to a comparative example.

First, the above-described problems are described in detail. FIG. 8 is a schematic cross-sectional view showing a surface emitting laser according to a comparative example. This surface emitting laser includes a first reflecting mirror 502, an active layer 504, a support layer 506, and a second reflecting mirror 516, arranged on a substrate 500. The second reflecting mirror 516 includes a beam 508, and a dielectric multilayer film (dielectric DBR) 510 formed on the beam 508. A gap AG is formed between the second reflecting mirror 516 and the active layer 504. Also, the beam 508 of the second reflecting mirror 516 is supported by the support layer 506. A light emitting portion 512 is arranged in the active layer 504. The light emitting portion 512 corresponds to the dielectric multilayer film 510.

The beam 508 is made of a single-crystal semiconductor, and has electrical conductivity. The beam 508 vibrates in the thickness direction of the active layer 504 by applying alternating-current voltage between a first electrode 524 provided below the substrate 500 and a second electrode 522 provided above the beam 508. Consequently, the dielectric multilayer film 510 also vibrates in the thickness direction of the active layer 504, the cavity length of the pair of reflecting mirrors including the first reflecting mirror 502 and the second reflecting mirror 516 varies, and light with a specific wavelength corresponding to the cavity length among light emitted by the light emitting portion 512 is emitted to the outside. Thus, the oscillation wavelength of the surface emitting laser is tunable.

Figure 2:
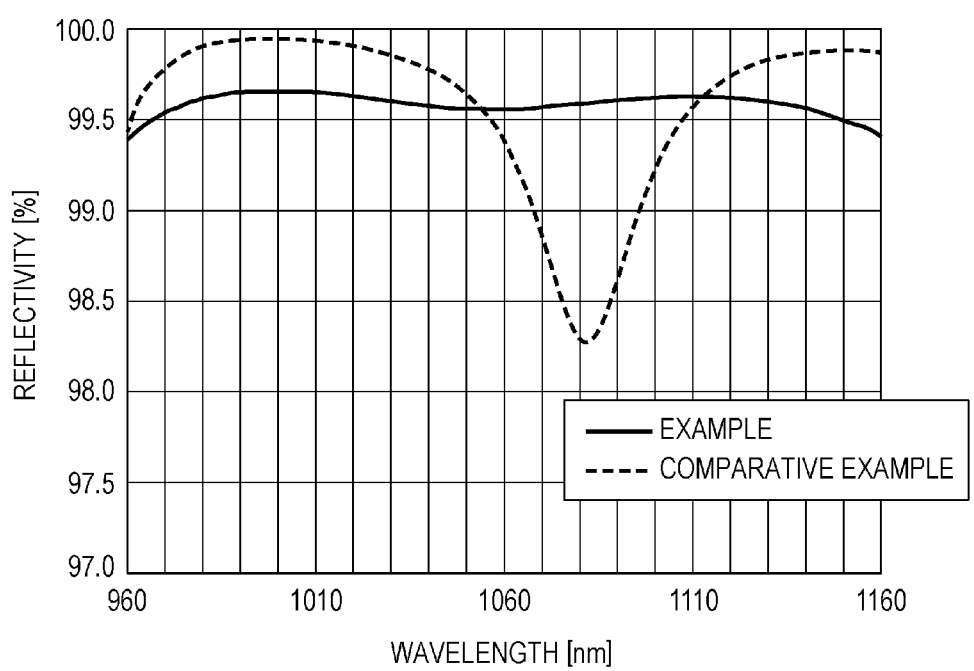
FIG. 2 is an illustration showing reflection characteristics of an upper reflecting mirror of the surface emitting laser according to the first embodiment.

The reflection spectrum of the second reflecting mirror 516 according to the comparative example is indicated by a broken line in FIG. 2. As described above, a dip is present in the second reflecting mirror 516 according to the comparative example. The dip is a region in which the reflectivity is largely decreased by 0.5% or more as compared with other regions. To be specific, the reflectivity is largely decreased in a wavelength band from 1060 nm to 1095 nm. In such a region, it may be difficult to generate laser oscillation, and the wavelength tunable band may become small.

As the result that the inventors energetically repeated reviewing, it was found that this phenomenon occurred if the beam 508 was present below the dielectric multilayer film 510. To be specific, an interference, in which reflected light R1 reflected by a surface of the beam 508 at a side of the dielectric multilayer film 510 and reflected light R2 reflected by a surface of the beam 508 at a side opposite to the dielectric multilayer film 510 weaken each other may occur with a specific wavelength according to the comparative example in FIG. 8.

To address this, a second reflecting mirror according to an embodiment of the present invention employs a configuration in which a beam has an opening and a dielectric multilayer film is arranged in the opening. With this configuration, since the beam is not provided at the position corresponding to a light emitting portion, the weakening interference in the beam does not occur. Consequently, as indicated by a solid line in FIG. 2, a dip is not generated in the reflection spectrum of the second reflecting mirror, and the wavelength tunable band can be widened.

A wavelength tunable surface emitting laser; and an information acquiring apparatus, an imaging apparatus, and a laser array including the surface emitting laser according to embodiments of the present invention are described below.

First Embodiment

Figure 1:
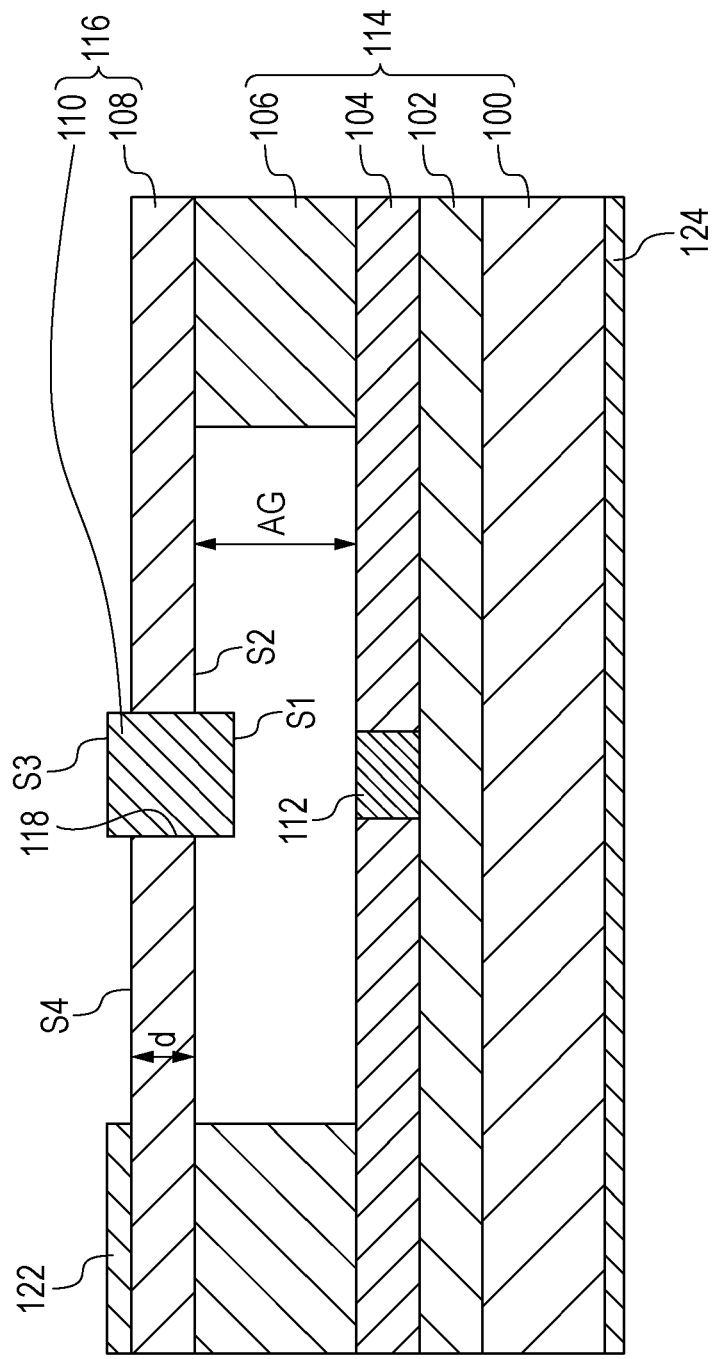
FIG. 1 is a schematic cross-sectional view showing an example of a surface emitting laser according to a first embodiment.

FIG. 1 is a schematic cross-sectional view showing an example of a surface emitting laser according to this embodiment. This surface emitting laser includes a first reflecting mirror 102, an active layer 104, a support layer 106, and a second reflecting mirror 116, arranged on a substrate 100. The second reflecting mirror 116 includes a beam 108, and a dielectric multilayer film (dielectric DBR) 110 supported by the beam 108. A gap AG is formed between the second reflecting mirror 116 and the active layer 104. Also, the beam 108 of the second reflecting mirror 116 is supported by the support layer 106. A light emitting portion 112 is arranged in the active layer 104. The light emitting portion 112 corresponds to the dielectric multilayer film 110. It is to be noted that the substrate 100, the first reflecting mirror 102, the active layer 104, and the support layer 106 may be occasionally collectively called semiconductor structure 114.

The beam 108 is made of a single-crystal semiconductor, and has electrical conductivity. The beam 108 vibrates in the thickness direction of the active layer 104 by applying alternating-current voltage between a first electrode 124 provided below the substrate 100 and a second electrode 122 provided above the beam 108. Consequently, the dielectric multilayer film 110 also vibrates in the thickness direction of the active layer 104. The cavity length of the pair of reflecting mirrors including the first reflecting mirror 102 and the second reflecting mirror 116 varies, and light with a specific wavelength corresponding to the cavity length among light emitted by the light emitting portion 112 is emitted to the outside. Thus, the oscillation wavelength of the surface emitting laser is tunable.

Also, in the surface emitting laser according to this embodiment, the beam 108 has an opening 118, and the dielectric multilayer film 110 is arranged in the opening 118. The opening 118 is provided at a position corresponding to the light emitting portion 112. Accordingly, as described above, the dielectric multilayer film 110 is also arranged at the position corresponding to the light emitting portion 112. Consequently, the beam 108 is not arranged at the position corresponding to the light emitting portion 112, and hence problems like those in the comparative example do not occur.

FIG. 2 indicates the reflection spectrum of the second reflecting mirror 116 according to this embodiment with the solid line. It is to be noted that the broken line indicates the reflection spectrum of the second reflecting mirror 516 according to the comparative example in FIG. 8. As described above, it is found that this embodiment keeps high reflectivity in a wider wavelength band than that of the comparative example. Accordingly, the tunable wavelength band of oscillation wavelengths of the wavelength tunable surface emitting laser can be widened.

Also, with the configuration of the second reflecting mirror 116 according to this embodiment, the cavity length (the optical distance between the pair of reflecting mirrors) can be decreased as compared with the comparative example. To be specific, when n represents a refractive index of a beam made of a single-crystal semiconductor, and d represents a thickness of the beam, the cavity length according to this embodiment can be decreased by at least (n−1)×d as compared with the comparative example. If the cavity length is small, a longitudinal mode interval Δλ expressed in Expression 1 can be large. Accordingly, a mode hop unlikely occurs, and a stable wavelength sweeping operation can be provided. The expression is as follows:

$$\Delta\lambda = \lambda^2/(2L)$$ Expression 1.

In this expression, λ represents a center wavelength of an oscillation wavelength band, and L represents a cavity length.

Also, a surface S1 of the dielectric multilayer film 110 facing the active layer 104 protrudes from the opening 118 toward a side of the active layer 104 with respect to a surface S2 of the beam 108 facing the active layer 104. Accordingly, the cavity length can be further decreased. With this configuration, the mode hop can be further restricted.

Further, a surface S3 of the dielectric multilayer film 110 opposite to the surface S1 facing the active layer 104 may protrude from the opening 118 with respect to a surface S4 of the beam 108 opposite to the surface S2 facing the active layer 104. Also, the surface S3 and the surface S4 may be at the same position, or the surface S3 may be close to the active layer 104 with respect to the surface S4.

Also, the support layer 106 may have a configuration in which a plurality of support layers are stacked. In this case, the respective support layers are desirably made of different single-crystal semiconductors.

While the dielectric multilayer film 110 of the second reflecting mirror 116 uses the dielectric DBR, the combination forming a dielectric of a high refractive index and a low refractive index may be selected in accordance with the wavelength band to be used. For example, if the oscillation wavelength band of the surface emitting laser is a 1-μm band, the dielectric multilayer film 110 may use a multilayer film of $Ta_2O_5$ and $SiO_2$ or a multilayer film of $TiO_2$ and $SiO_2$. The reflection band as the dielectric multilayer film 110 is determined on the basis of the difference in refractive index between two dielectrics. Hence, it is important to have a large difference in refractive index between the two dielectrics as possible. On the other hand, the reflectivity of the dielectric multilayer film 110 increases if the number of stacked films increases. However, as the number of stacked films increases, the cost and difficulty in manufacturing increase. Also, a resonant frequency f of the second reflecting mirror 116 being a movable mirror is typically expressed by the following expression:

$$f = \alpha \times (k/m)^{1/2}$$ Expression 2.

In this expression, α represents a constant determined on the basis of the structure of the second reflecting mirror 116, k represents a spring constant of the second reflecting mirror 116, and m represents an effective mass of the second reflecting mirror 116. As the number of stacked films of the dielectric multilayer film 110 increases, the mass increases, and hence the resonant frequency decreases as found from Expression 2. Owing to this, the number of stacked films of the dielectric multilayer film 110 is desirably as small as possible to be minimally required. For example, the number of stacked films is determined to attain a reflectivity of about 99.5% in a desirable wavelength band as one measure of the number of stacked films.

Figure 3:
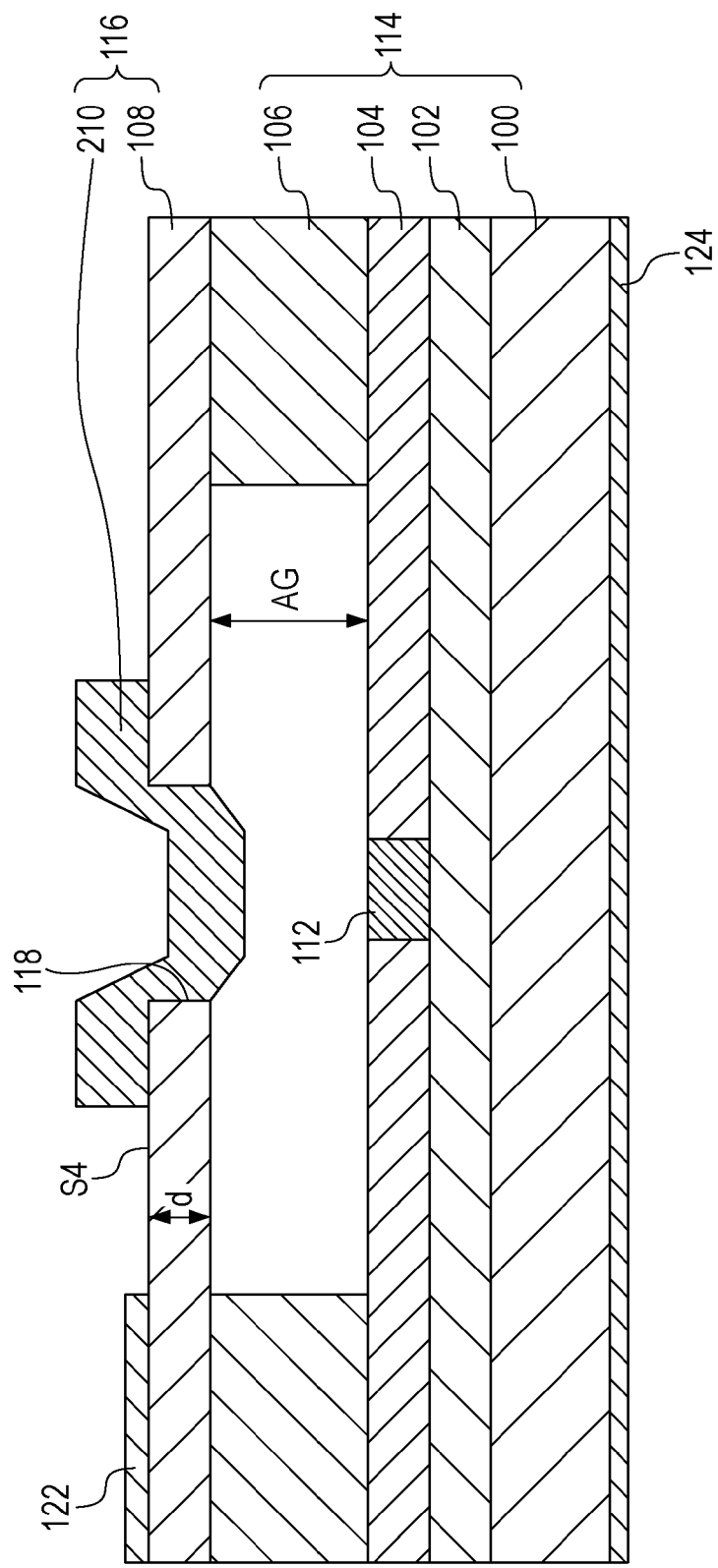
FIG. 3 is a schematic cross-sectional view showing another example of the surface emitting laser according to the first embodiment.

In the viewpoint of decreasing the mass of the second reflecting mirror 116, the dielectric multilayer film 110 is desirably provided only in the opening 118 in the beam 108 corresponding to the light emitting portion 112. On the other hand, in the viewpoint of durability of a dielectric multilayer film 210, as shown in FIG. 3, the dielectric multilayer film 210 is desirably arranged continuously from the opening 118 in the beam 108 to a portion around the opening 118 of the surface S4 of the beam 108 at the side opposite to the active layer 104. With this configuration, the bonding area between the dielectric multilayer film 210 and the beam 108 can be increased, hence the adhesion between the dielectric multilayer film 210 and the beam 108 is increased, and peel-off of the dielectric multilayer film 210 from the beam 108 can be decreased.

Figure 4A:
FIG. 4A is a schematic view showing an example of a beam of the surface emitting laser according to the first embodiment.
Figure 4B:
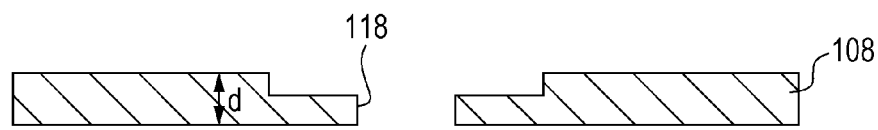
FIG. 4B is a schematic view showing another example of the beam of the surface emitting laser according to the first embodiment.

Also, with the configuration shown in FIG. 3, it is desirable to decrease the thickness the portion of the beam 108 around the beam 108 as compared with the thickness of the remaining portion of the beam 108 other than the portion around the opening 118. This can decrease occurrence of cutting the dielectric multilayer film 210 at a step of the opening 118. For example, the thickness of the beam 108 may be continuously decreased toward the opening 118 as shown in FIG. 4A, or the thickness of the beam 108 may be decreased stepwise toward the opening 118 as shown in FIG. 4B.

Figure 4C:
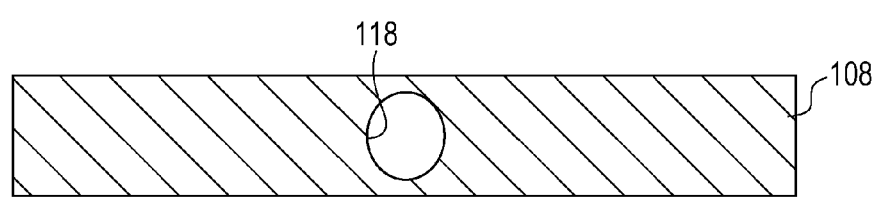
FIG. 4C is a schematic view showing still another example of the beam of the surface emitting laser according to the first embodiment.
Figure 4D:
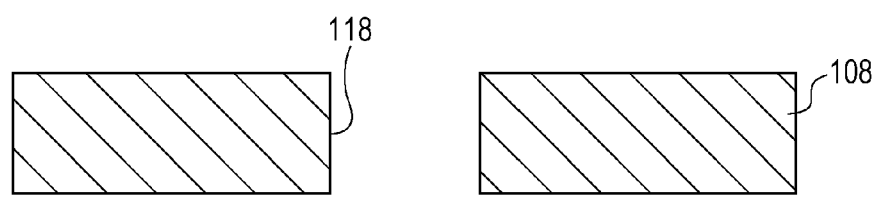
FIG. 4D is a schematic view showing yet another example of the beam of the surface emitting laser according to the first embodiment.

Alternatively, the opening 118 may be formed in a through hole penetrating through the beam 108 as shown in FIG. 4C. Still alternatively, its plane shape may be circular, elliptic, or rectangular. Alternatively, the opening 118 may be a slit cutting the beam 108 as shown in FIG. 4D. That is, the beam 108 is not connected due to the opening 118. In this case, as shown in FIG. 3, the dielectric multilayer film 210 is desirably arranged continuously from the opening 118 in the beam 108 to the portion of the beam 108 around the opening 118.

The materials of respective layers of the semiconductor structure 114 may be selected in accordance with the wavelength to be used. For example, the respective layers of the semiconductor substrate 114 may use a GaAs-based material, an InP-based material, a GaN-based material, etc.

Also, the first reflecting mirror 102 may use dielectric DBR or semiconductor DBR. Also, the first reflecting mirror 102 may be a diffraction grating, for example, a high index contrast grating (hereinafter, referred to as HCG) mirror. The HCG mirror has a configuration in which a material with a high refractive index and a material with a low refractive index are alternately periodically arranged in the in-plane direction. For example, a configuration in which a high refractive region ($Al_{0.7}Ga_{0.3}As$) and a low refractive region (the air) are alternately periodically arranged in the in-plane direction can be obtained by partly removing a material with a high refractive index (for example, $Al_{0.7}Ga_{0.3}As$) and hence periodically forming a slit (an opening). As the HCG, one described in any of PTL 1 and PTL 2 can be used.

Also, FIG. 1 illustrates an optical pumping surface emitting laser. Hence, an external light source (not shown) is provided as a unit configured to cause the surface emitting laser to emit light. However, the surface emitting laser according to this embodiment may be applied to an electrical pumping surface emitting laser. The electrical pumping surface emitting laser may additionally include a pair of electrodes for carrier injection. Alternatively, one of the first electrode 124 and second electrode 122 may also serve as one of the pair of electrodes for carrier injection. For example, a configuration may be employed in which a third electrode (not shown) is formed on the active layer 104, the beam 108 is driven by applying alternating-current voltage between the second electrode 122 and the third electrode, current is applied to the light emitting portion 112 by using the first electrode 124 and the third electrode, and hence the light emitting portion 112 emits light. Also, the surface emitting laser according to this embodiment may have a defining structure that defines a light emitting region such as an oxidation confinement structure, or a current confinement structure that defines an electrical pumping region.

In this embodiment, the single surface emitting laser has been described. However, an embodiment of a laser array in which a plurality of surface emitting lasers are arranged in an array form may be applied.

Second Embodiment

In this embodiment, an example of an information acquiring apparatus using the surface emitting laser according to the first embodiment as a light source device is described. A wavelength tunable light source device can be used as a light source for optical communication or a light source for optical measurement. Further, a wavelength tunable light source device can be used as a light source device for an information acquiring apparatus that acquires information on the inside of a measurement object in a noninvasive and nondestructive manner. An optical coherence tomography apparatus (hereinafter, referred to as OCT apparatus) is described below with reference to FIG. 5, as an example of an information acquiring apparatus using a light source device according to this embodiment.

Figure 5:
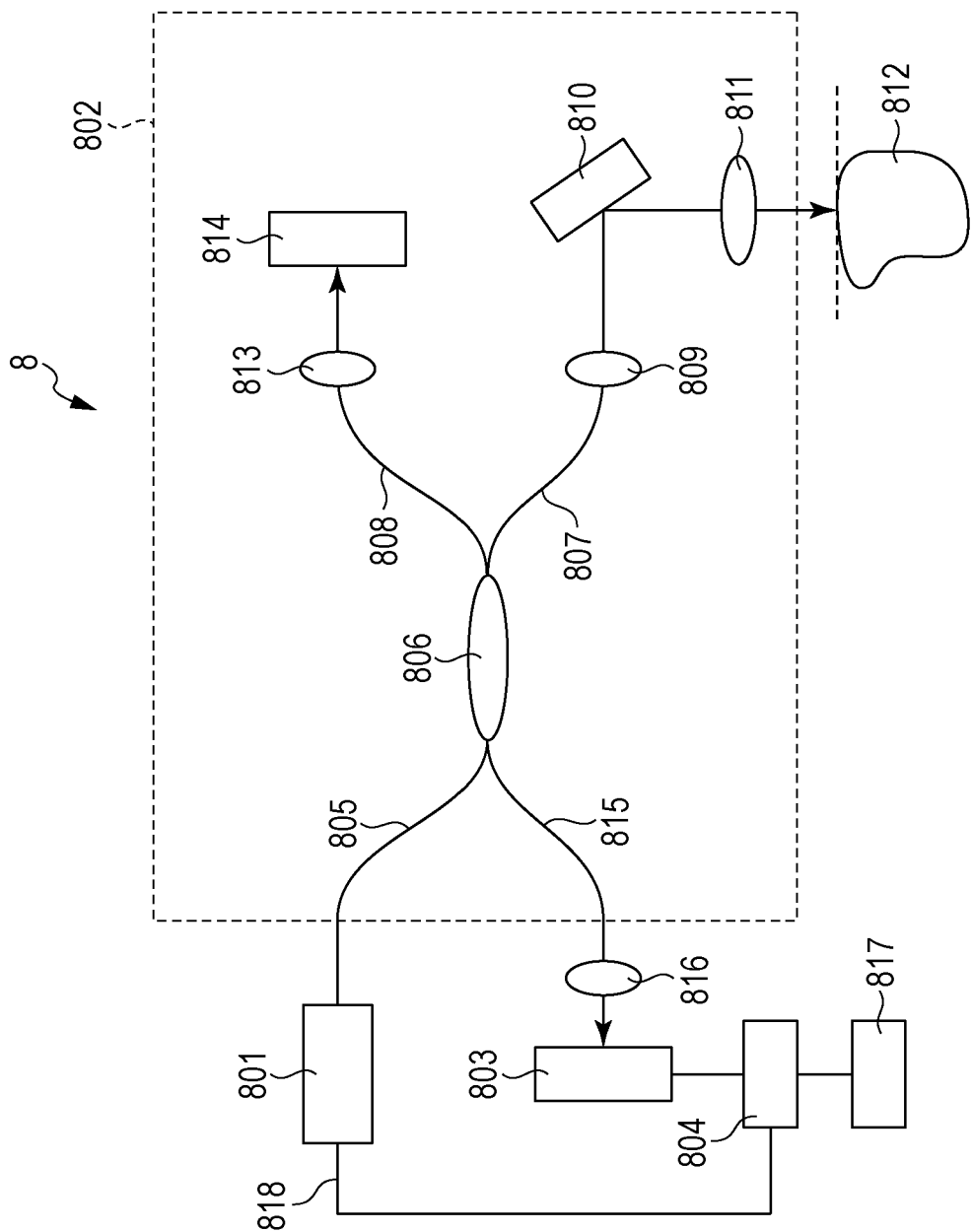
FIG. 5 is a schematic view showing an example of an imaging apparatus according to a second embodiment.

FIG. 5 is a schematic illustration showing an OCT device 8 according to this embodiment. The OCT device 8 includes at least a light source device 801, an interference optical system 802, a light detecting unit 803, and an information acquiring unit 804 that acquires information on the inside of a measurement object. The surface emitting laser according to the first embodiment or second embodiment may be used as the light source device 801. Although not shown, the information acquiring unit 804 has a Fourier transformer. The configuration that the information acquiring unit 804 has the Fourier transformer is not particularly limited as long as the information acquiring unit 804 has a function of executing Fourier transform on input data. For example, the information acquiring unit 804 may have an arithmetic unit and the arithmetic unit may have the function of executing Fourier transform. To be specific, the arithmetic unit is a computer including CPU, and the computer executes an application having the Fourier transform function. For another example, the information acquiring unit 804 may have a Fourier transform circuit having the Fourier transform function.

Light output from the light source device 801 passes through the interference optical system 802, and is output as interfering light having information on an object 812 of a measurement object. The interfering light is received by the light detecting unit 803. The light detecting unit 803 may be a differential detecting type or a simple intensity monitoring type. Information on a time waveform of the intensity of the received interfering light is sent from the light detecting unit 803 to the information acquiring unit 804. The information acquiring unit 804 acquires a peak value of the time waveform of the intensity of the received interfering light, executes Fourier transform, and hence acquires information (for example, information on a tomographic image) about the object 812. The light source device 801, the interference optical system 802, the light detecting unit 803, and the information acquiring unit 804 described above may be provided if desired.

A process from when light is emitted from the light source device 801 to when the information on the inside of the object being the measurement object is obtained is described in detail below. The light output from the light source device 801 passes through a fiber 805, enters a coupler 806, and is split into irradiation light passing through an irradiation-light fiber 807 and reference light passing through a reference-light fiber 808. The coupler 806 is configured to operate in a single mode in the wavelength band of the light source. Various fiber couplers may be configured of 3-dB couplers. The irradiation light passes through a collimator 809, hence becomes parallel light, and is reflected by a mirror 810. The light reflected by the mirror 810 passes through a lens 811, is emitted on the object 812, and is reflected by respective layers in the depth direction of the object 812.

On the other hand, the reference light passes through a collimator 813, and is reflected by a mirror 814. In the coupler 806, interfering light is generated by the reflected light from the object 812 and the reflected light from the mirror 814. The interfering light passes through a fiber 815, passes through a collimator 816 to be collected, and is received by the light detecting unit 803. Information on the intensity of the interfering light received by the light detecting unit 803 is converted into electric information such as a voltage and is sent to the information acquiring unit 804. The information acquiring unit 804 processes the data of the intensity of the interfering light, or more particularly executes Fourier transform, and hence acquires information on a tomographic image. The data of the intensity of the interfering light for Fourier transform is data generally sampled at an interval of an equivalent number of waves. However, data sampled at an interval of an equivalent wavelength may be also used.

The acquired information on the tomographic image may be sent from the information acquiring unit 804 to an image display 817 and displayed as an image. By scanning the mirror 810 in a plane perpendicular to the incidence direction of the irradiation light, a three-dimensional tomographic image of the object 812 of the measurement object can be obtained. Also, the light source device 801 may be controlled by the information acquiring unit 804 through an electric circuit 818. Although not shown, the intensity of light output from the light source device 801 may be continuously monitored and the data may be used for correcting the amplitude of the signal indicating the intensity of the interfering light.

An OCT device is suitable for acquiring a tomographic image of the inside of a living body, such as an animal or a human, in the fields of ophthalmology, dentistry, dermatology, etc. The information relating to a tomographic image of a living body includes not only a tomographic image of a living body but also numerical data required for acquiring a tomographic image. In particular, it is desirable to use an OCT device when a measurement object is an eye fundus, a tooth, or a blood vessel of a human body and information relating to a tomographic image of any of these is acquired.

Example 1

This example relates to a surface emitting laser shown in FIG. 1. That is, the surface emitting laser is one corresponding to the first embodiment. FIGS. 6A to 6E are illustrations explaining a method of manufacturing the surface emitting laser according to this example.

Figure 6A:
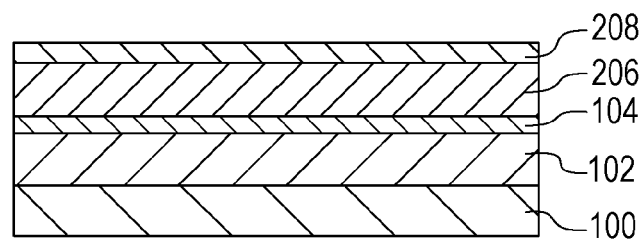
FIG. 6A is a schematic cross-sectional view showing an example of a method of manufacturing a surface emitting laser according to Example 1.

First, as shown in FIG. 6A, a first reflecting mirror 102 made of semiconductor DBR configured by stacking 30 pairs of AlAs/GaAs is formed on a GaAs substrate 100. Then, an active layer 104 including a quantum well layer of InGaAs is formed on the first reflecting mirror 102. Then, a GaAs sacrificial layer 206 and an $(Al_{0.7}Ga_{0.3})_{0.5}As$ beam precursor layer 208 made of a single-crystal semiconductor are formed on the active layer 104. The sacrificial layer 206 and the beam precursor layer 208 are formed respectively with thicknesses of 2120 nm and 909 nm. A portion of the sacrificial layer 206 becomes the support layer 106 in FIG. 1, and the beam precursor layer 208 becomes the beam 108 in FIG. 1. The beam precursor layer 208 is formed in a pattern that covers a region to be a light emitting portion of the active layer 104 and covers not the all of but only a portion of the sacrificial layer 206. In this example, epitaxial growth is continuously provided from the first reflecting mirror 102 to the beam precursor layer 208. Also, the beam precursor layer 208 is doped with Si by about $3 \times 10^{18}/cm^3$ to increase electrical conductivity.

Figure 6B:
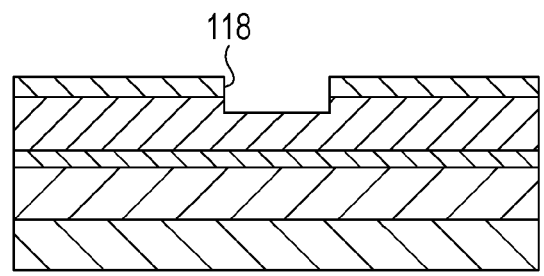
FIG. 6B is a schematic cross-sectional view showing the example of the method of manufacturing the surface emitting laser according to Example 1.

Then, as shown in FIG. 6B, an opening 118 is formed to penetrate through the beam precursor layer 208. In this example, by using reactive ion etching (RIE) with $SiCl_4$ and Ar, overetching by 100 nm was executed on the beam precursor layer 208, and hence the opening 118 extending to a portion of the sacrificial layer 206 was formed.

Figure 6C:
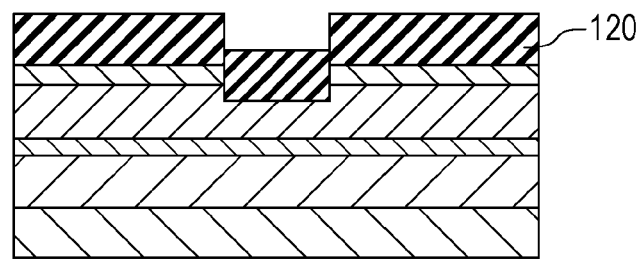
FIG. 6C is a schematic cross-sectional view showing the example of the method of manufacturing the surface emitting laser according to Example 1.

Then, as shown in FIG. 6C, a dielectric DBR layer 120 is formed on the beam precursor layer 208 and the sacrificial layer 206 through the opening 118 provided in the beam precursor layer 208. In this example, the dielectric DBR layer is formed by stacking 8 pairs of $TiO_2/SiO_2$ with an optical length of $\lambda/4$ by sputtering.

Figure 6D:
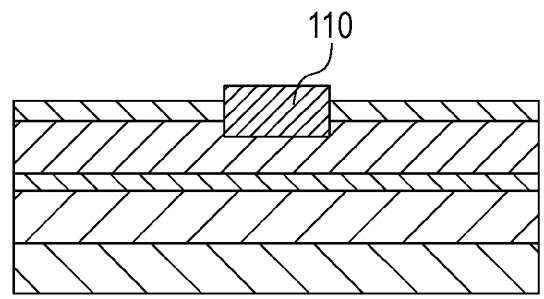
FIG. 6D is a schematic cross-sectional view showing the example of the method of manufacturing the surface emitting laser according to Example 1.

Then, as shown in FIG. 6D, the dielectric DBR layer 120 on the beam precursor layer 208 is removed by RIE using $CF_4$, and hence a dielectric multilayer film 110 is formed only in the opening 118.

Figure 6E:
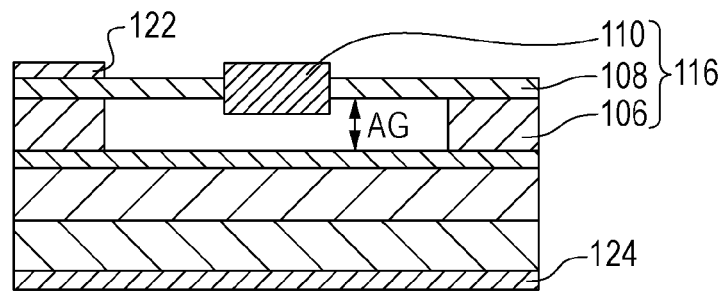
FIG. 6E is a schematic cross-sectional view showing the example of the method of manufacturing the surface emitting laser according to Example 1.

Then, as shown in FIG. 6E, AuGe/Ni/Au are formed for a first electrode 124, and Au/Ti are formed for a second electrode 122. Further, a portion of the sacrificial layer 206 is selectively removed from the portion not covered with the beam precursor layer 208 by using an etchant containing citric acid and aqueous hydrogen peroxide, and hence a gap AG and a beam 108 are formed. A portion not removed among the sacrificial layer 206 serves as a support layer 106. Thus, the surface emitting laser shown in FIG. 1 is manufactured.

The solid line in FIG. 2 illustrates the reflection spectrum of a second reflecting mirror 116 of the surface emitting laser manufactured as described above. Also, the broken line in FIG. 2 illustrates the reflection spectrum of the comparative example shown in FIG. 8, that is, the second reflecting mirror 516 of the surface emitting laser without the opening 118. As shown in FIG. 2, a dip with a large reflectivity is generated around 1082 nm in the comparative example, and a wavelength range with a reflectivity lower than 99.5% is generated for about 50 nm. In contrast, it can be recognized that the reflectivity of 99.5% is kept for 180 nm from about 970 nm to about 1150 nm in this example. That is, with this example, a wide wavelength tunable band can be ensured.

Also, the longitudinal mode interval was measured in the comparative example and this example. The longitudinal mode interval of the comparative example was 85 nm and the longitudinal mode interval of this example was 160 nm. Accordingly, a stable wavelength sweeping operation can be executed.

Example 2

This example is for the surface emitting laser corresponding to the first embodiment. FIGS. 7A to 7E are illustrations explaining a method of manufacturing the surface emitting laser according to this example. This example differs from Example 1 in that a plurality of sacrificial layers (a plurality of support layers) are provided. Other configurations are similar to those of Example 1. Points different from Example 1 are mainly described below.

First, as shown in FIGS. 7A to 7E, similarly to Example 1, a first reflecting mirror 102 and an active layer 104 are formed on a GaAs substrate 100. Then, a GaAs first sacrificial layer 306, an AlInP second sacrificial layer 307, and an $(Al_{0.7}Ga_{0.3})_{0.5}As$ beam precursor layer 208 made of a single-crystal semiconductor are formed on the active layer 104. The first sacrificial layer 306, the second sacrificial layer 307, and the beam precursor layer 208 are formed respectively with thicknesses of 2120 nm, 100 nm, and 909 nm. Portions of the first sacrificial layer 306 and the second sacrificial layer 307 become support layers, and the beam precursor layer 208 becomes a beam. The beam precursor layer 208 is formed in a pattern that covers a region to be a light emitting portion of the active layer 104 and covers not the all of but only portions of the first sacrificial layer 306 and the second sacrificial layer 307. Also in this example, similarly to Example 1, epitaxial growth is continuously provided from the first reflecting mirror 102 to the beam precursor layer 208. Also, the beam precursor layer 208 is doped with Si by about $3 \times 10^{18}/cm^3$ to increase electrical conductivity.

Figure 7A:
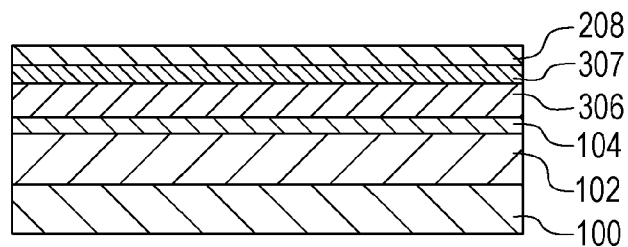
FIG. 7A is a schematic cross-sectional view showing an example of a method of manufacturing a surface emitting laser according to Example 2.
Figure 7B:
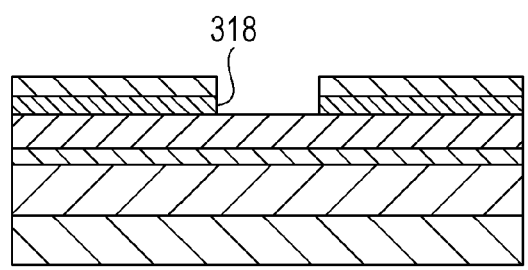
FIG. 7B is a schematic cross-sectional view showing the example of the method of manufacturing the surface emitting laser according to Example 2.

Then, as shown in FIG. 7B, an opening 318 is formed to penetrate through the beam precursor layer 208. In this example, by using reactive ion etching (RIE) with $SiCl_4$ and Ar, overetching by 50 nm was executed on the beam precursor layer 208. Then, wet etching was executed on the second sacrificial layer 307 by using a hydrochloricacid-based etchant, and hence an opening 118 was formed. The first sacrificial layer 306 was used as a stop layer in wet etching using the hydrochloric-acid-based etchant. In Example 1, when the opening 318 is formed, the depth of the opening 318 may vary for about 80 nm depending on the in-plane distribution of the etching speed of a RIE device. In this example, since the first sacrificial layer 306 is used as the etching stop layer, the variation in depth of the opening 318 can be decreased to about 10 nm.

Figure 7C:
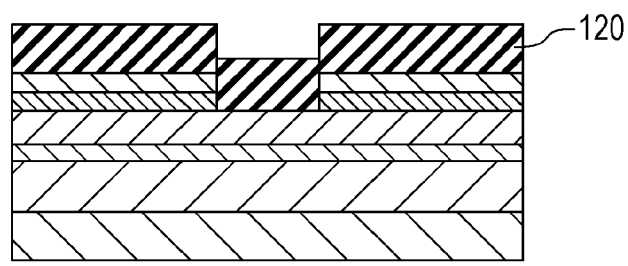
FIG. 7C is a schematic cross-sectional view showing the example of the method of manufacturing the surface emitting laser according to Example 2.
Figure 7D:
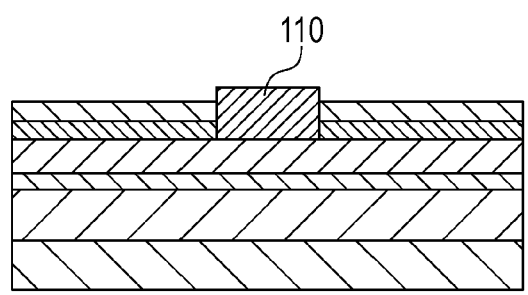
FIG. 7D is a schematic cross-sectional view showing the example of the method of manufacturing the surface emitting laser according to Example 2.
Figure 7E:
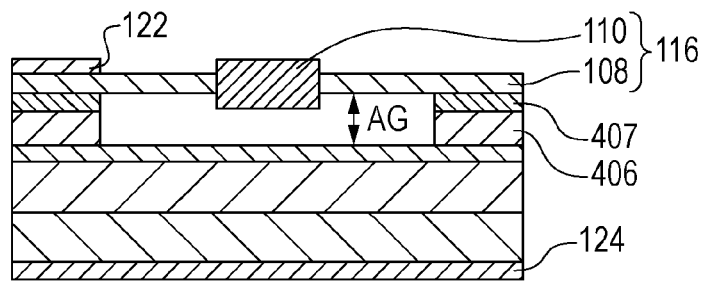
FIG. 7E is a schematic cross-sectional view showing the example of the method of manufacturing the surface emitting laser according to Example 2.

The other part is similar to Example 1. That is, as shown in FIG. 7C, a dielectric DBR layer 120 is formed. Then, as shown in FIG. 7D, a portion of the dielectric DBR layer 120 arranged above the beam precursor layer 208 is removed, and a dielectric multilayer film 110 is formed only in the opening 318. Then, as shown in FIG. 7E, a first electrode 124 and a second electrode 122 are formed. Further, a portion of the first sacrificial layer 306 and a portion of the second sacrificial layer 307 are selectively removed from the portion not covered with the beam precursor layer 208. Thus, a gap AG and a beam 108 are formed. The remaining portions of the first sacrificial layer 306 and second sacrificial layer 307 not removed become a first support layer 406 and a second support layer 407. Thus, a surface emitting laser is manufactured.

A second reflecting mirror 116 of the surface emitting laser in this example can obtain characteristics, in particular, the reflection spectrum and longitudinal mode interval, equivalent to the characteristics of the surface emitting laser in Example 1. In addition, although the surface emitting laser manufactured in Example 1 has a variation of about 12 nm in initial oscillation wavelength; however, the variation in this example is less than 2 nm. This is because a variation in depth of the opening 318 is decreased by using one of the plurality of sacrificial layers as the stop etching layer and hence a variation in initial cavity length can be decreased.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-265572, filed Dec. 26, 2014 and No. 2015-222514 filed Nov. 12, 2015, which are hereby incorporated by reference herein in their entirety.

REFERENCE SIGNS LIST 102 first reflecting mirror
108 beam
110 dielectric multilayer film
116 second reflecting mirror
104 active layer

The invention claimed is:
1. A surface emitting laser comprising:
a first reflecting mirror;
a second reflecting mirror; and
an active layer arranged between the first reflecting mirror and the second reflecting mirror,
wherein a gap is formed between the second reflecting mirror and the active layer,
wherein an oscillation wavelength is tunable,
wherein the second reflecting mirror includes a beam comprising a single-crystal semiconductor and a dielectric multilayer film supported by the beam, and
wherein the dielectric multilayer film is arranged in an opening formed in the beam,
wherein a surface of the dielectric multilayer film facing the active layer protrudes from the opening toward a side of the active layer with respect to a surface of the beam facing the active layer, and
wherein the dielectric multilayer film is arranged continuously from inside the opening to a portion around the opening and on top of the surface of the beam opposite to the surface facing the active layer.

2. The surface emitting laser according to claim 1, wherein the surface emitting laser has a semiconductor structure including the active layer, and
wherein the semiconductor structure includes a support layer comprising a single-crystal semiconductor configured to support the beam.

3. The surface emitting laser according to claim 2, wherein the support layer includes a plurality of support layers comprising different single-crystal semiconductors.

4. The surface emitting laser according to claim 1, wherein the beam has a thickness that is decreased toward the opening.

5. An information acquiring apparatus comprising:
the surface emitting laser according to claim 1; and
an information acquiring unit configured to acquire information on the inside of a measurement object.

6. An imaging apparatus comprising:
the surface emitting laser according to claim 1;
an interference optical system configured to split light from the surface emitting laser into irradiation light that is emitted on a measurement object and reference light, and generate interfering light from reflected light of the light emitted on the measurement object and the reference light;
a light detecting unit configured to receive the interfering light; and
an information acquiring unit configured to acquire information on the measurement object on the basis of a signal from the light detecting unit.

7. A laser array comprising a plurality of surface emitting lasers, wherein at least one of the plurality of surface emitting lasers is the surface emitting laser according to claim 1.

8. The surface emitting laser according to claim 1, wherein the first reflecting mirror, the active layer, and the beam of the second reflecting mirror is a continuous single-crystal semiconductor.

9. The surface emitting laser according to claim 1, wherein the single-crystal semiconductor beam is grown continuously from a substrate to the beam.

10. The surface emitting laser according to claim 1, wherein one or more of the following:
(i) the dielectric multilayer film projects downward or towards the active layer with respect to the opening of the beam; and
(ii) the dielectric multilayer film is a dielectric distributed Bragg reflector (DBR).

11. A surface emitting laser comprising:
a first reflecting mirror;
a second reflecting mirror; and
an active layer arranged between the first reflecting mirror and the second reflecting mirror,
wherein the second reflecting mirror includes a beam and a multilayer film supported by the beam,
wherein a gap is formed between the second reflecting mirror and the active layer,
wherein the multilayer film is arranged in-inside an opening formed in the beam, wherein the multilayer film is arranged continuously from the opening to a portion around the opening and on top of the surface of the beam opposite to the surface facing the active layer, and wherein a surface of the dielectric multilayer film facing the active layer protrudes from the opening toward a side of the active layer with respect to a surface of the beam facing the active layer.

* * * * *